United States Patent
Kanakasabapathy et al.

(10) Patent No.: US 7,772,663 B2
(45) Date of Patent: Aug. 10, 2010

(54) METHOD AND APPARATUS FOR BITLINE AND CONTACT VIA INTEGRATION IN MAGNETIC RANDOM ACCESS MEMORY ARRAYS

(75) Inventors: Sivananda Kanakasabapathy, Hopewell Junction, NY (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 531 days.

(21) Appl. No.: 11/677,447

(22) Filed: Feb. 21, 2007

(65) Prior Publication Data

US 2008/0198647 A1     Aug. 21, 2008

(51) Int. Cl.
*G11C 11/02* (2006.01)
(52) U.S. Cl. .............. 257/422; 257/427; 257/E21.665; 257/E27.006; 257/E43.004; 438/3
(58) Field of Classification Search ........... 257/421, 257/422, 427, E21.665, E27.006, E43.004; 438/3
See application file for complete search history.

(56) References Cited

U.S. PATENT DOCUMENTS

| | | | |
|---|---|---|---|
| 6,803,615 B1 | 10/2004 | Sin et al. | |
| 7,635,884 B2 * | 12/2009 | Gaidis et al. | 257/295 |
| 2005/0258542 A1 * | 11/2005 | Fuller et al. | 257/759 |
| 2007/0023806 A1 * | 2/2007 | Gaidis et al. | 257/295 |
| 2009/0302405 A1 * | 12/2009 | Gaidis et al. | 257/421 |

FOREIGN PATENT DOCUMENTS

TW     266413 (B)     11/2006

OTHER PUBLICATIONS

Office Action from CN 2008100058717, Feb. 12, 2010, copy consists of 8 pages.

* cited by examiner

*Primary Examiner*—Anh Phung
*Assistant Examiner*—Michael Lulis (57) ABSTRACT

In one embodiment, the invention is a method and apparatus for bitline and contact via integration in magnetic random access memory arrays. One embodiment of a magnetic random access memory according to the present invention includes a magnetic tunnel junction and a top wire that surrounds the magnetic tunnel junction on at least three sides.

19 Claims, 10 Drawing Sheets

METHOD AND APPARATUS FOR BITLINE AND CONTACT VIA INTEGRATION IN MAGNETIC RANDOM ACCESS MEMORY ARRAYS

BACKGROUND OF THE INVENTION

The present invention generally relates to computer memory technology, and more particularly relates to magnetic random access memory (MRAM).

Magnetic random access memory (MRAM) is based on magnetic tunnel junctions (MTJ). An MTJ consists of two magnetic films: a pinned layer (PL) and a free layer (FL). The direction of the magnetization of the PL is pinned or fixed, while the magnetization of the FL is programmable to be either parallel (logical "0" state) or anti-parallel (logical "1" state) to that of the PL in the "WRITE" operation. A thin tunnel barrier (formed, e.g., of aluminum oxide) is sandwiched between the PL and the FL, and the resistance of the MRAM depends on the direction of the FL magnetization relative to the PL's magnetization. The state of the MRAM is sensed in the "READ" operation by comparing the resistance of the tunnel junction to standard cells.

Figure 1A:
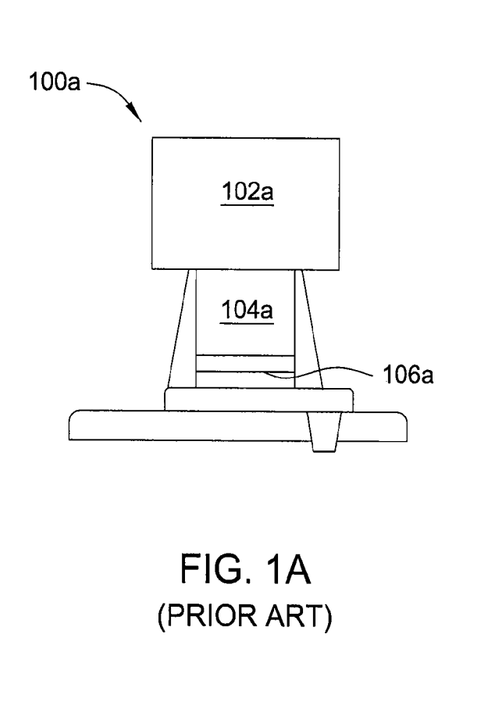
FIGS. 1A-1C are cross sectional diagrams illustrating various conventional techniques for forming MTJ stacks.
Figure 1B:
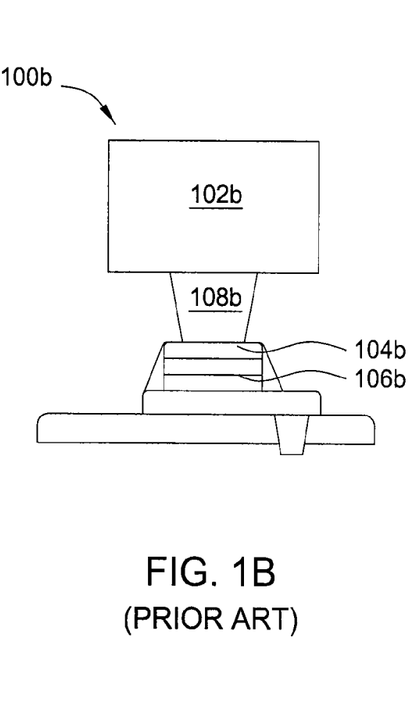
Figure 1C:
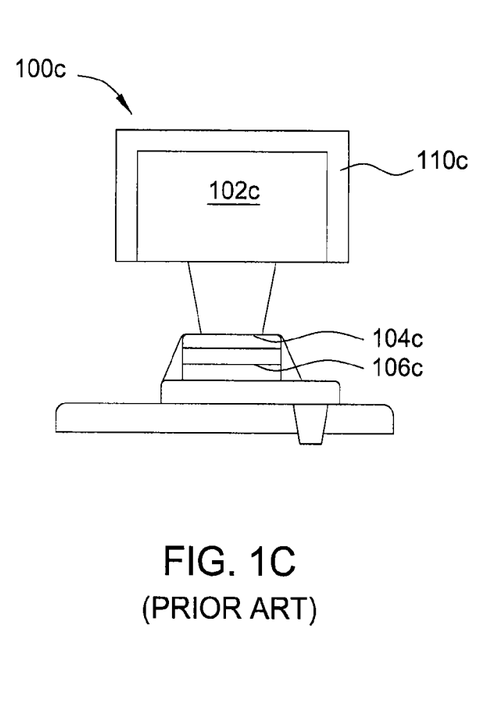

FIGS. 1A-1C are cross sectional diagrams illustrating various conventional techniques for forming MTJ stacks. In order to measure the resistance of an MTJ during the READ operation, two contacts (one each to the top and bottom of the MTJ) are necessary. The top contact is generally formed using one or two standard techniques. FIG. 1A, for example, illustrates an MTJ stack 100a that is patterned using a thick (e.g., approximately 1000 Angstroms) conductive hardmask 104a. The bitline 102a is sunk to contact the top of the hardmask 104a, thereby making electrical contact with the tunnel junction 106a. While this technique is relatively simple and inexpensive, the tall hardmask 104a is a source of shadowing for Ion Beam Etch (IBE)-based tunnel junction patterning.

FIG. 1B, on the other hand, illustrates an MTJ stack 100b that is patterned using a thin (e.g., approximately 400-600 Angstroms) hardmask 104b. In this case, the bitline 102b is terminated above the top of the hardmask 104b, and a via (VJ) 108b is dropped for electrical contact to the tunnel junction 106b. While the thin hardmask 104b minimizes shadowing (e.g., from tilted IBE or from any beam divergence in vertical IBE), this technique suffers from potential incompatibility with any ferromagnetic liner scheme, as discussed in further detail below.

FIG. 1C illustrates an MTJ stack 100c in which the bitline 102c is clad on three sides (all except the side facing the tunnel junction 106c) with a top ferromagnetic liner (TFML) 110c, in order to maximize the magnetic field generated per unit of current. Fabrication of TFMLs poses a particular challenge, because it requires either extraction of magnetic materials from the bottom of a damascene trench or a smooth trench bottom.

Therefore, there is a need in the art for a method and apparatus for bitline and contact via integration in magnetic random access memory arrays.

SUMMARY OF THE INVENTION

In one embodiment, the invention is a method and apparatus for bitline and contact via integration in magnetic random access memory arrays. One embodiment of a magnetic random access memory according to the present invention includes a magnetic tunnel junction and a top wire that surrounds the magnetic tunnel junction on at least three sides.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and apparatus for bitline and contact via integration in magnetic random access memory arrays. In order maximize magnetic coupling between the top wires (e.g., bitlines or wordlines) of a magnetic tunnel junction (MTJ), embodiments of the present invention sink the wires deep enough to engulf the tunnel junction from the top. The bottom of the wires are close to or aligned to the free layers, and a short via junction (VJ) and thin hardmask are contained within the thick wires This architecture achieves improved magnetic coupling without increasing peripheral logic capacitance.

Figure 2:
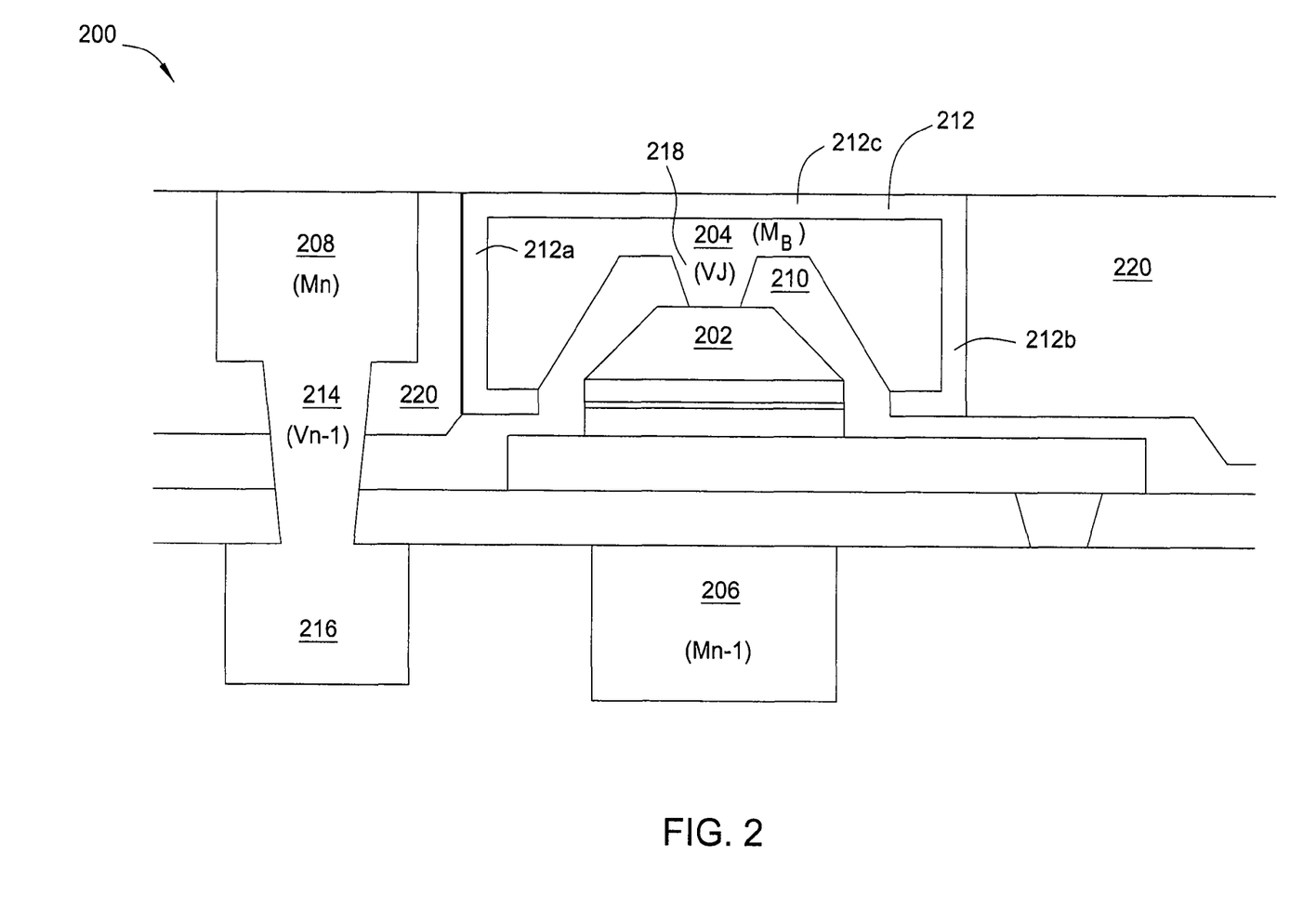
FIG. 2 is a cross sectional view illustrating one embodiment of a magnetic tunnel junction stack in which the bitline and tunnel junction are integrated, according to the present invention.

FIG. 2 is a cross sectional view illustrating one embodiment of a magnetic tunnel junction (MTJ) stack 200 in which the bitline and tunnel junction (TJ) are integrated, according to the present invention.

As illustrated, the MTJ stack 200 comprises a TJ 202, a bitline ($M_B$) 204, a plurality of wordlines ($M_{n-1}$) 206 and peripheral wiring ($M_n$) 208. The bitline 204 substantially surrounds or engulfs the TJ 202 on at least three sides (from the top) and is substantially separated therefrom by a dielectric under layer 210. The bitline 204 is, in turn, lined by a ferromagnetic liner 212 that comprises at least two opposing sidewalls 212a and 212b, and optionally includes a top wall 212c to which the two opposing sidewalls 212a and 212b are coupled. An inter-level dielectric layer 220 surrounds the ferromagnetic liner 212 and the peripheral wiring 208. Although the top wall 212c of the ferromagnetic liner 212 is illustrated in FIG. 2 as being substantially flush with the inter-level dielectric layer 220, such configuration is not required. A peripheral wiring via ($V_{n-1}$) 214 connects the peripheral wiring 208 to a peripheral interconnect area 216. A tunnel junction via (VJ) 218 inside the bitline 204 connects the bitline 204 to the TJ 202. As described in greater detail below, the peripheral wiring via 214 and the tunnel junction via 218 may be formed in the MTJ stack 200 substantially simultaneously (i.e., in a common reticle/mask) or one after the other (i.e., in separate reticles/masks).

Figure 4:
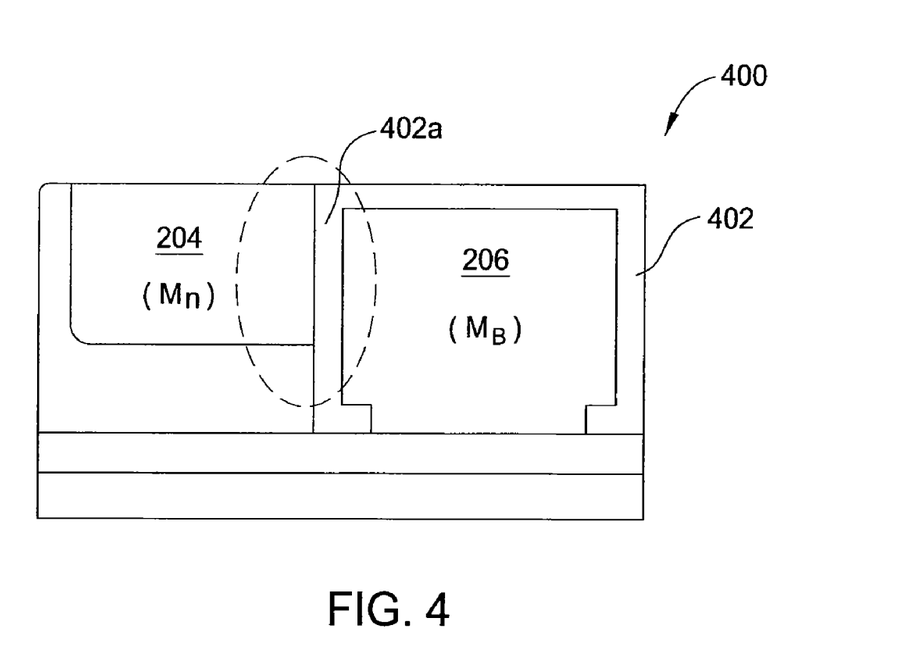
FIG. 4 is a cross sectional diagram of a magnetic tunnel junction stack in which the sidewall of the top ferromagnetic liner blocks direct contact between the peripheral logic wiring and the bitline.
Figure 5A:
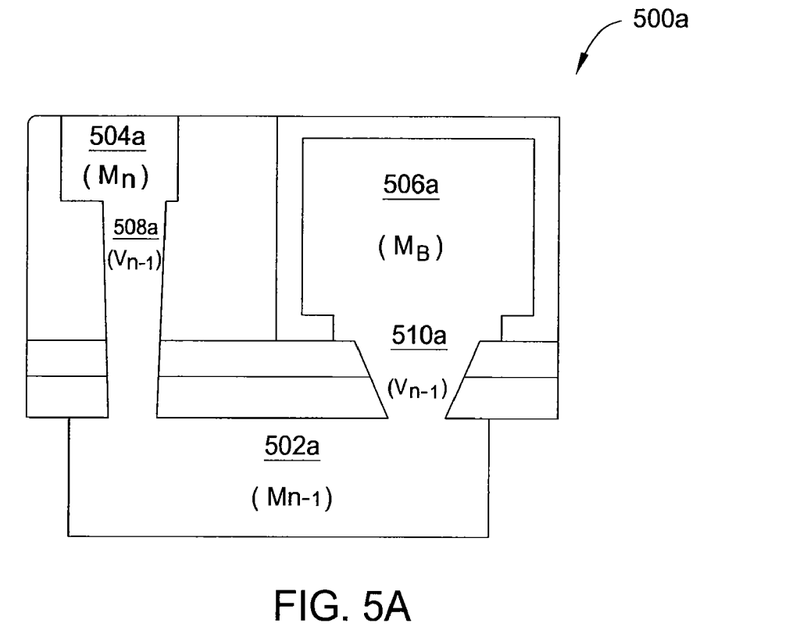
FIG. 5A is a cross sectional view of a magnetic tunnel junction stack in which a metal level below the peripheral logic wiring and the bitline allows for electrical connection between the peripheral logic wiring and the bitline.
Figure 5B:
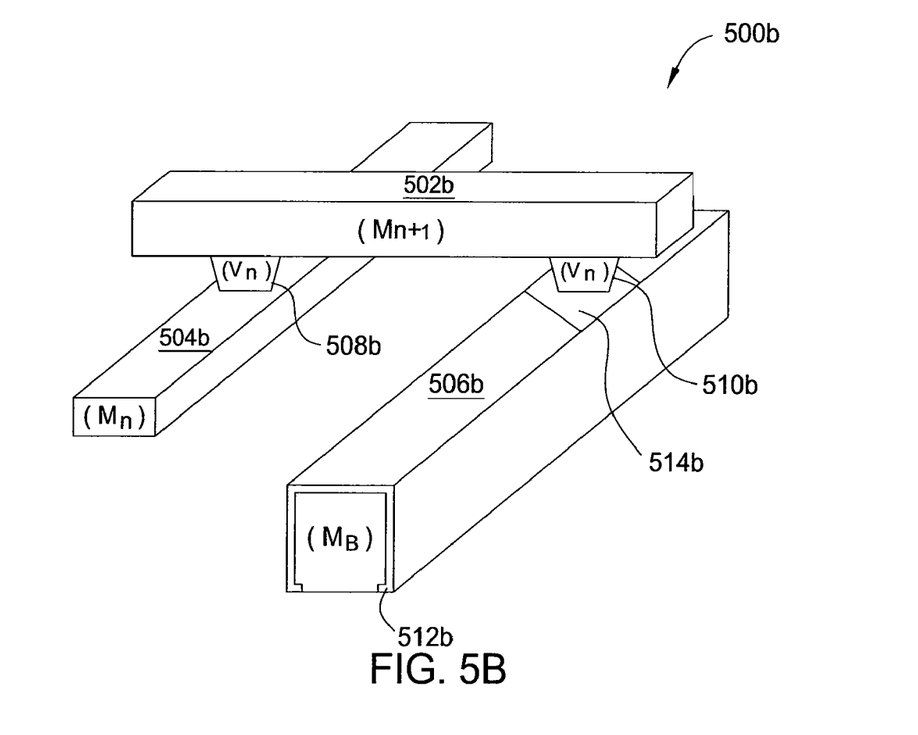
FIG. 5B is an isometric view of a magnetic tunnel junction stack in which a metal level above the peripheral logic wiring and the bitline allows for electrical connection between the peripheral logic wiring and the bitline.

The peripheral logic wiring 208 is electrically connected to the bitline 204 through the metal levels above or below the peripheral logic wiring 208 or the bitline 204, since the presence of the ferromagnetic liner 212 (particularly the sidewall of the ferromagnetic liner 212 that faces the peripheral logic wiring 208) makes intra-level connection difficult. This is especially difficult when selective FML is desired in the wordlines but not in the peripheral logic wiring, and yet a level of wiring above or below is not used to connect the wordlines and the peripheral logic wiring. This difficulty is illustrated, for example, by FIG. 4, which is a cross sectional diagram of an MTJ stack 400 in which the sidewall 402a of the TFML 402 blocks direct contact between the peripheral logic wiring ($M_n$) 204 and the bitline ($M_B$) 206. FIG. 5A, by contrast, is a cross sectional view of an MTJ stack 500a in which a metal level 502a ($M_{n-1}$) below the peripheral logic wiring ($M_n$) 504a and the bitline ($M_B$) 506a allows for electrical connection between the peripheral logic wiring 504a and the bitline 506a (through a peripheral logic via ($V_{n-1}$) 508a and a tunnel junction via ($V_{n-1}$) 510a). Alternatively, FIG. 5B is an isometric view of an MTJ stack 500b in which a metal level 502b ($M_{n+1}$) above the peripheral logic wiring ($M_n$) 504b and the bitline ($M_B$) 506b allows for electrical connection between the peripheral logic wiring 504b and the bitline 506b (through a peripheral logic via ($V_{n-1}$) 508b and a tunnel junction via ($V_{n-1}$) 510b). It is to be further noted that in the embodiment illustrated in FIG. 5B, the location 514b at which the tunnel junction via 510b makes contact with the bitline 506b is not coated with the TFML 512b (i.e., as opposed to the remainder of the bitline 506b).

The wordlines 206 are illustrated as being oriented parallel to the bitline 204 for the purposes of clarity; however, those skilled in the art will appreciate that the wordlines 206 are generally oriented in a perpendicular manner. Moreover, although the top wires are described as being bitlines 204, those skilled in the art will appreciate that the top wires may be wordlines as well as bitlines. It will also be noted that, in the illustrated embodiment, the peripheral wiring 208 is shallower than the bitline 204.

By sinking the bitline 204 deep enough to engulf the TJ 202 from the top, magnetic coupling between the bitline 204 and the TJ 202 is maximized. The short tunnel junction via 218 and a thin hardmask are contained within the thick bitline 204. Thus, the architecture of the MTJ stack 200 allows density to be traded for a higher magnetic field (i.e., by means of higher current through thicker wires) and tighter magnetic coupling.

In one embodiment, the ferromagnetic liner 212 is limited to the bitline 204, but absent in peripheral wiring 208, although both the bitline 204 and the peripheral wiring 212 would normally be lined up physically in the same level of the integration. This enhances compatibility of the MTJ stack 200 with host logic in embedded applications by substantially eliminating the increased inductance and attendant delays in the peripheral wiring 212 that are meant to carry information. Moreover, intra-level capacitance requirements of the logic circuitry contained within the wordlines 206 and the peripheral logic wiring 208 prevent the peripheral logic wiring 208 from being sunk as deeply as the bitline 204. Thus, although the bitline 204 and the peripheral logic wiring 208 are located at substantially the same vertical level of the integration, this architecture requires that the bitline 204 and the peripheral logic wiring 208 be formed in a mutually exclusive manner (i.e., from two different reticles and etch steps). In one embodiment, this is accomplished using tri-layer lithography, as described in further detail below with respect to FIGS. 3A-3M.

In another embodiment, the bitline 204 and the peripheral logic wiring 208 are formed concurrently (i.e., using the same reticle and etch step), and are thus substantially equally deep (and optionally both include a ferromagnetic liner). In the case where both the bitline 204 and the peripheral logic wiring 208 are lined with a ferromagnetic liner, the direct connection of the bitline 204 and the peripheral logic wiring 208 results in a TFML interface between the bitline 204 and the peripheral logic wiring 208 conductors (e.g., similar to the situation illustrated in FIG. 4). Since the materials that form the TFMLs (e.g., typically ferromagnetic metals and their alloys) are poor conductors, this architecture increases the line resistance and power dissipation in the bitline circuitry. This stands in contrast to the embodiment illustrated in FIG. 2, wherein there is intra-level isolation of the bitline 204 and the peripheral logic wiring 208. As described above, in this configuration, electrical connection of the bitline 204 and the peripheral logic wiring 208 is through the peripheral wiring 214, the tunnel junction via 218 and the wordlines 206 (e.g., similar to the situation illustrated in FIGS. 5A and 5B).

FIGS. 3A-3M are cross sectional views illustrating one embodiment of a method for fabricating a magnetic tunnel junction (MTJ) stack, according to the present invention. In particular, FIGS. 3A-3M illustrate a method of fabricating the MTJ of FIG. 2. Thus, FIGS. 3A-3M also serve as a flow diagram for this method.

Figure 3A:
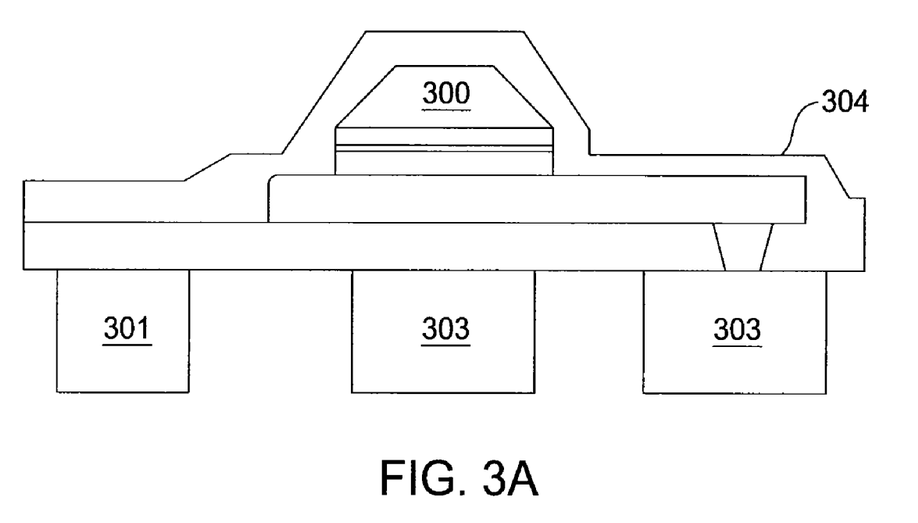
FIGS. 3A-3M are cross sectional views illustrating one embodiment of a method for fabricating a magnetic tunnel junction stack, according to the present invention.

Starting with FIG. 3A, the MTJ 300 is isolated, etched and encapsulated with a dielectric under layer 304. In one embodiment, the under layer material is selected so as to provide good encapsulation of the MTJ 300 and good adhesion to subsequent inter-level dielectrics. Thus, in one embodiment, the under layer 304 is formed from at least one of: silicon nitride (SiN), silicon carbide (BloK) or silicon carbonitride (nitrogen-doped silicon carbide or n-BloK). It is to be noted that the MTJ stack also includes a peripheral interconnect area 301 and a plurality of metal lines 303 (a memory array area including wordlines and landing pads). The metal lines 303 are omitted from subsequent drawings for the purposes of clarity, but it will be understood by those skilled in the art that the metal lines 303 are still considered to be a part of the MTJ stack.

Figure 3B:
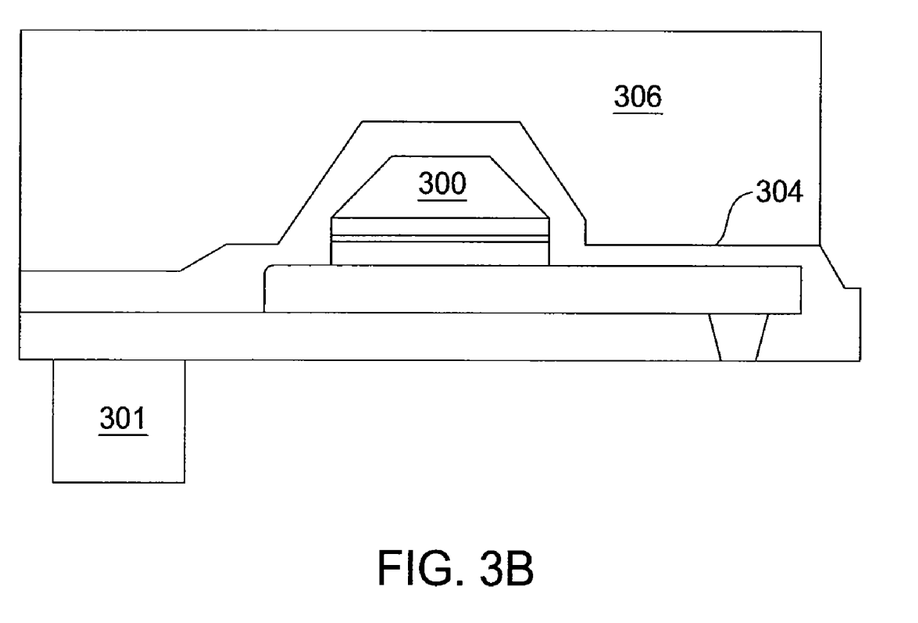

In FIG. 3B, an inter-level dielectric 306 is applied over the MTJ 300 to achieve planarity. In one embodiment, the inter-level dielectric 306 is applied by plasma-enhanced chemical vapor deposition of silicon-based materials (e.g., tetraethylorthosilicate or TEOS, silane oxide or carbon-doped silicon oxide or SiCOH), followed by a planarization polish. In another embodiment, the inter-level dielectric 306 is applied by spin-on dielectrics (e.g., porous low-k dielectrics).

Figure 3C:
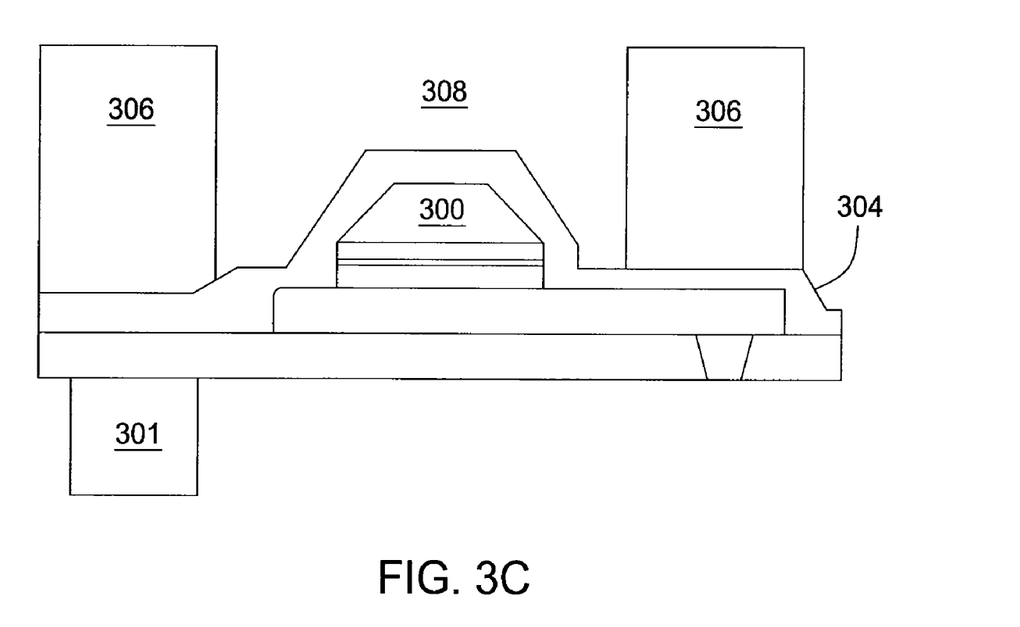

In FIG. 3C, a deep bitline trench 308 is defined in the inter-level dielectric 306. In one embodiment, the bitline trench 308 is defined using Reactive Ion Etching. In one embodiment, the bitline trench 308 is designed to be selective to the inter-level dielectric 306 (i.e., such that the bitline trench 308 terminates at the under layer 304).

Figure 3D:
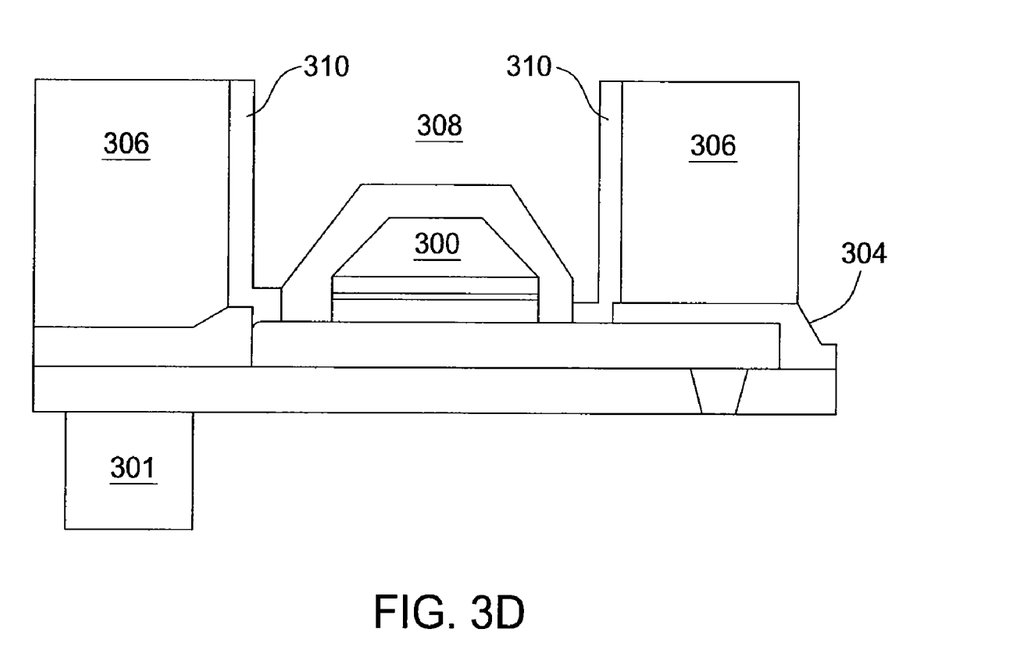

In FIG. 3D, a top ferromagnetic liner (TFML) 310 is deposited to line the bitline trench 308. In one embodiment, the TFML is deposited in accordance with the methods described in U.S. patent application Ser. No. 10/899,488 (Publication No. 2006/0019487), which is herein incorporated by reference in its entirety.

Figure 3E:
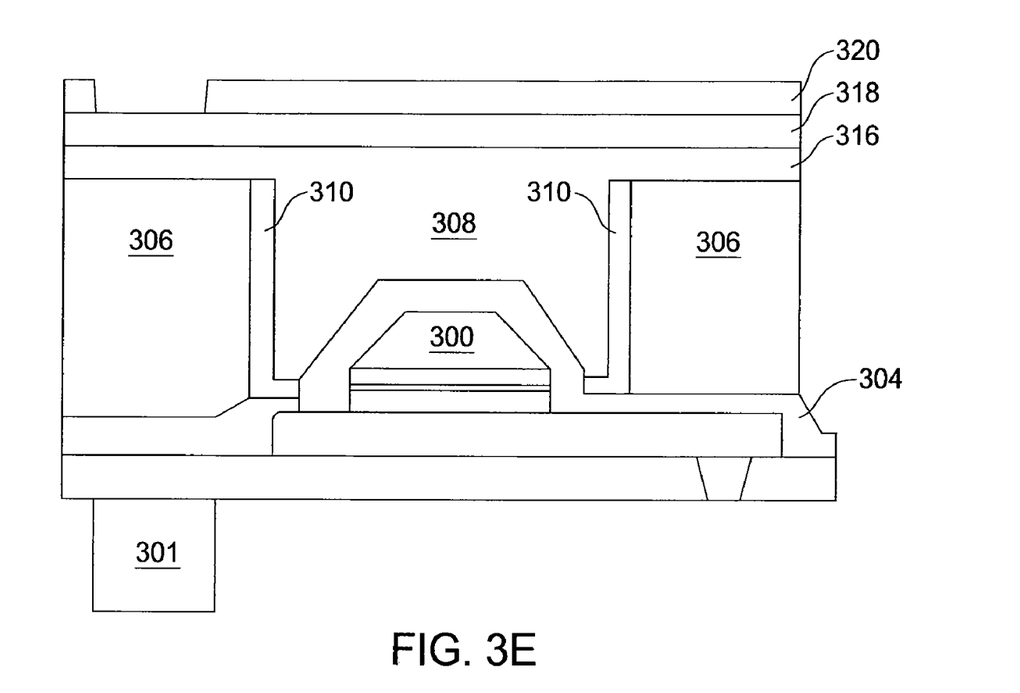
Figure 3F:
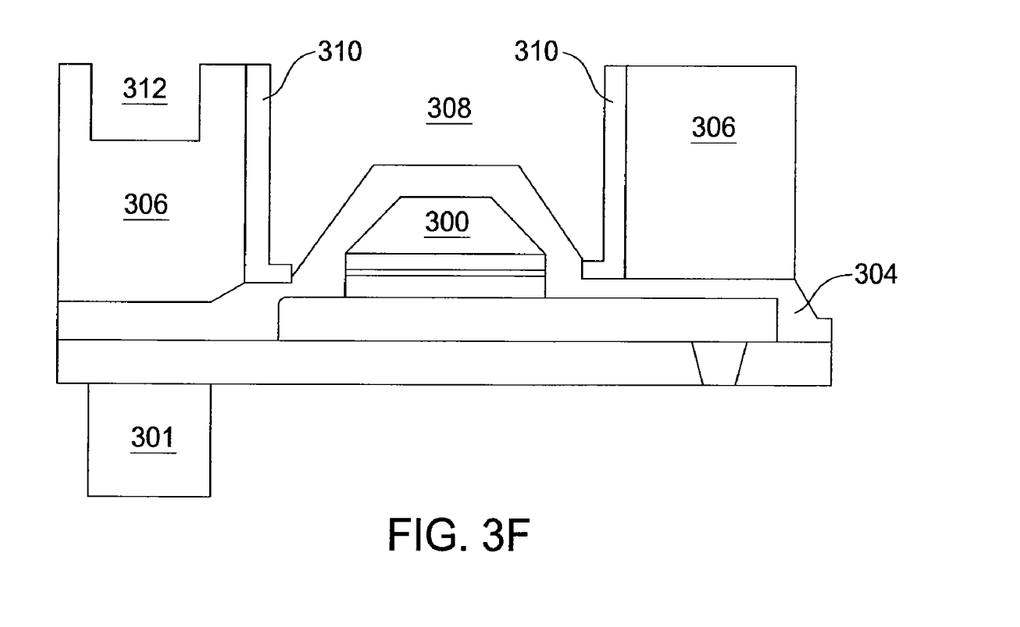

In FIGS. 3E and 3F, once the TFML 310 is formed on the bitline trench 308, a damascene trench 312 is etched in the inter-level dielectric 306 for formation of peripheral wiring (i.e., peripheral circuitry other than bitlines). In one embodiment, the damascene trench 312 is etched using tri-layer lithography that employs a first planarizing layer 316 (which fills the bitline trench 308), a first inorganic transfer or capping layer 318 and a first imaging layer (photoresist) 320 (FIG. 3E). In one embodiment, the first imaging layer 320 additionally includes a bottom anti-reflective coating (BARC) (not shown). Formation of the damascene trench 312 includes strip of the planarizing layers (i.e., the first planarizing layer 316, the first inorganic transfer layer 318 and the first imaging layer 320) (FIG. 3F).

Figure 3G:
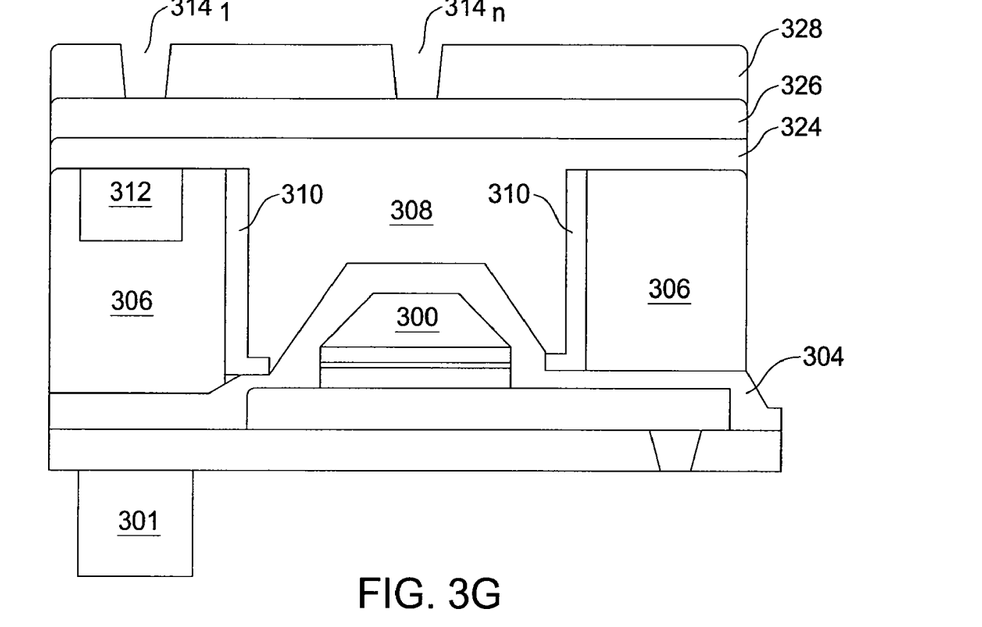
Figure 3H:
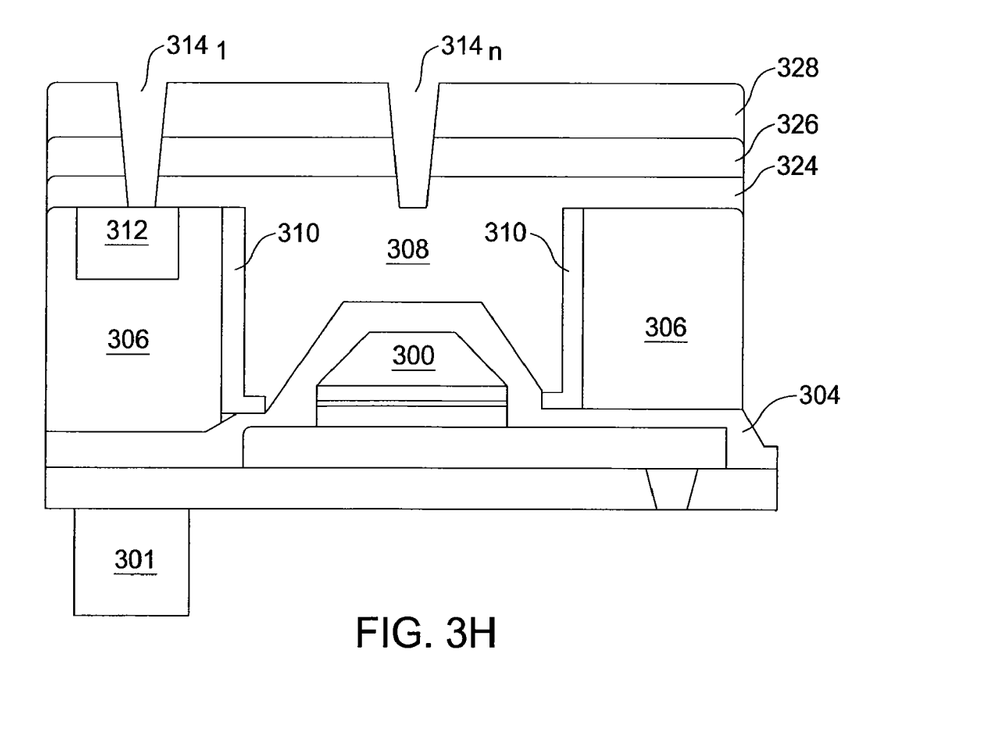

In FIG. 3G, one or more vias $314_1$-$314_n$ (hereinafter collectively referred to as "vias 314") are defined in the imaging layer 320. In one embodiment, the vias are defined using tri-layer lithography (including layers 324, 326 and 328), as described above. In this case, the vias 314 are first defined in the second imaging layer 328.

Figure 3I:
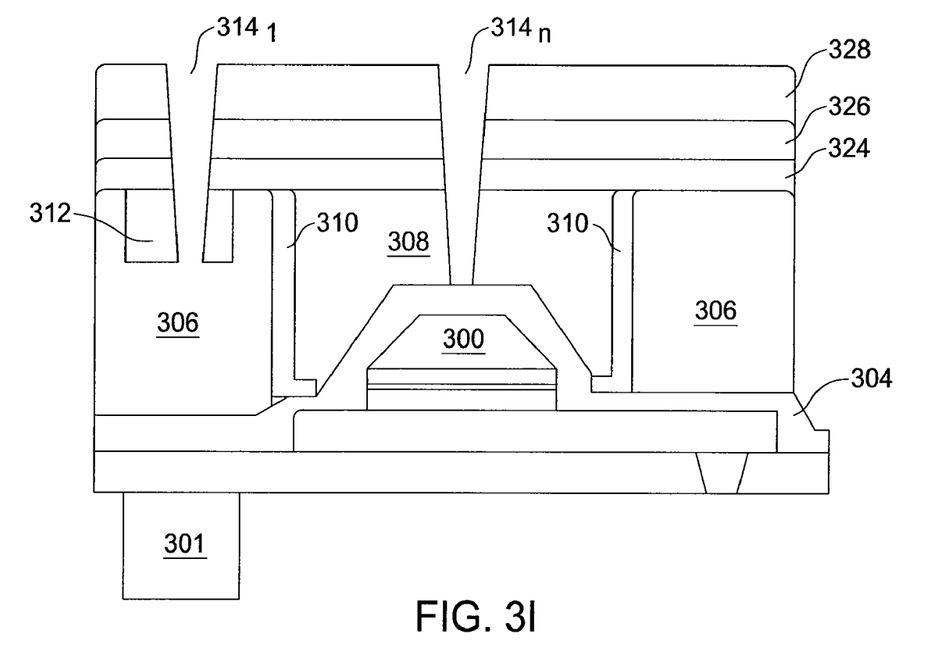
Figure 3J:
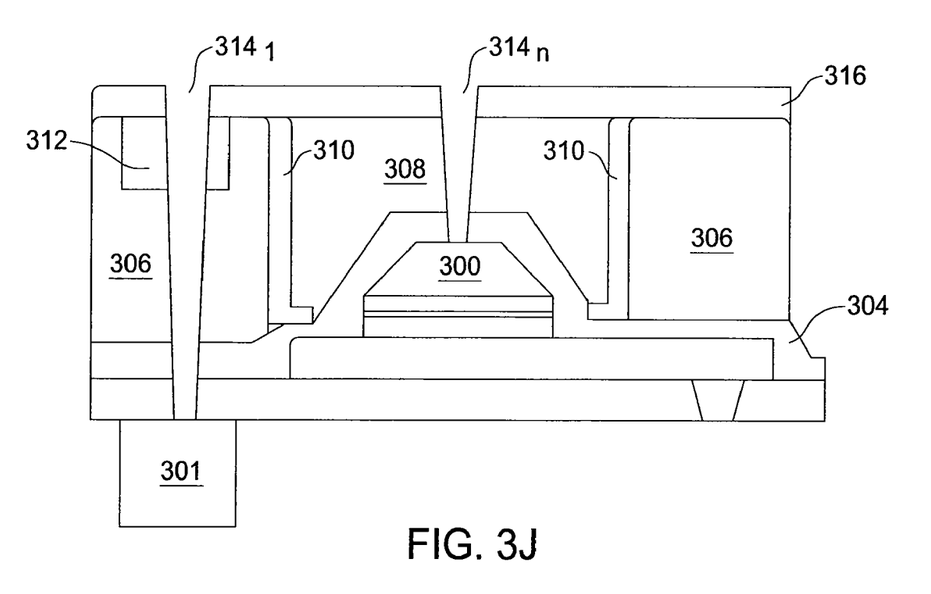
Figure 3K:
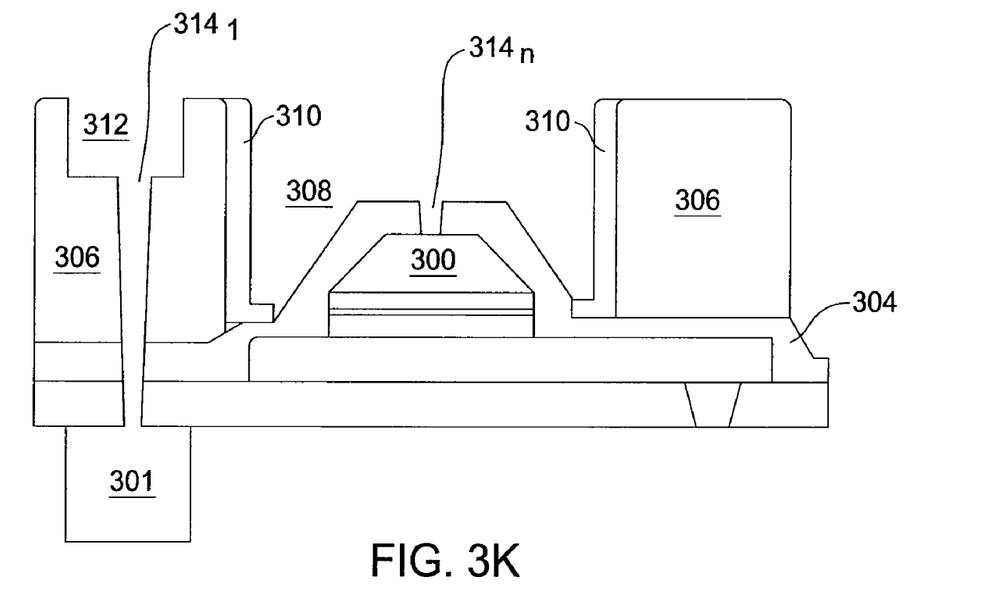

In FIGS. 3H, 3I, 3J and 3K, the vias 314 are etched, by a sequence of etches, into the second inorganic transfer layer 318 and the second planarizing later 316. In one embodiment, the sequence includes etch/opening of the second inorganic transfer layer 318 (FIG. 3H) and transfer of the etch pattern into the second planarizing layer 316 (FIG. 3I). The vias 314 are then further etched into the inter-level dielectric 306 and dielectric under layer 304 and land on metal in the memory array and peripheral interconnect areas (FIG. 3J). The second planarizing layer 316 is then stripped (FIG. 3K).

Figure 3L:
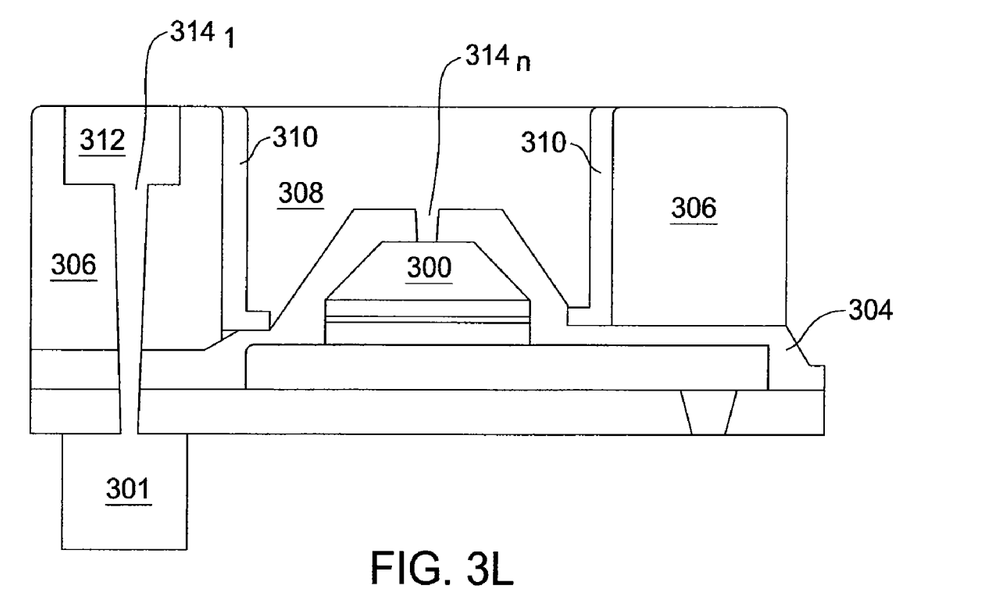
Figure 3M:
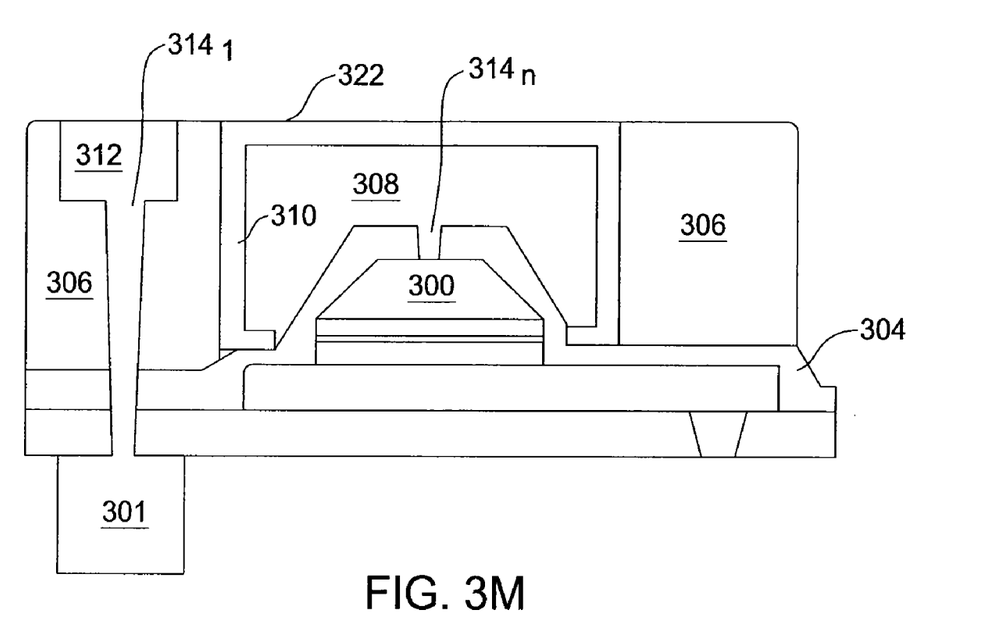

In FIG. 3L, the quadruple damascene structure (i.e., the bitline 308, the peripheral wiring/damascene trench 312 and the vias 314) is metallized and polished. Then, in FIG. 3M, a top strap 322 of the TFML 310 is formed. In one embodiment, the top strap 322 is formed in accordance with one or more of the techniques described in U.S. patent application Ser. No. 10/899,488.

Thus, the present invention represents a significant advancement in the field of computer memory technology. Embodiments of the invention maximize magnetic coupling between the top wires (e.g., bitlines or wordlines) of a magnetic tunnel junction (MTJ) by sinking the wires deep enough to engulf the tunnel junction from the top. The bottom of the wires are close to or aligned to the free layers, and a short via junction (VJ) and thin hardmask are contained within the thick wires. This architecture achieves improved magnetic coupling without increasing peripheral logic capacitance.

While the foregoing is directed to the illustrative embodiment of the present invention, other and further embodiments of the invention may be devised without departing from the basic scope thereof, and the scope thereof is determined by the claims that follow.

The invention claimed is:

1. A magnetic random access memory, comprising:
   a magnetic tunnel junction; and
   a top wire that surrounds the magnetic tunnel junction on at least three sides of the magnetic tunnel junction, wherein the top wire is lined by a ferromagnetic liner.

2. The magnetic random access memory of claim 1, wherein the top wire is a bitline.

3. The magnetic random access memory of claim 1, wherein the top wire is a wordline.

4. The magnetic random access memory of claim 1, wherein the top wire further surrounds a via that couples the top wire to the magnetic tunnel junction.

5. The magnetic random access memory of claim 1, wherein said ferromagnetic liner comprises at least: a top wall; a first sidewall coupled to the top wall; and a second sidewall coupled to the top wall and disposed opposite the first sidewall.

6. The magnetic random access memory of claim 1, further comprising:
   peripheral logic wiring electrically connected to the top wire.

7. The magnetic random access memory of claim 6, wherein the top wire is sunk more deeply than the peripheral logic wiring is sunk.

8. A method for forming a magnetic random access memory, comprising: providing a magnetic tunnel junction; surrounding the magnetic tunnel junction on at least three sides with a top wire; and lining the top wire with a ferromagnetic liner.

9. The method of claim 8, wherein the top wire is a bitline.

10. The method of claim 8, wherein the top wire is a wordline.

11. The method of claim 8, further comprising:
    providing a dielectric under layer between the magnetic tunnel junction and the top wire.

12. The method of claim 11, wherein the top wire is formed by:
    applying an inter-level dielectric over the dielectric under layer; and
    defining a trench for the top wire in the inter-level dielectric.

13. The method of claim 12, further comprising:
    etching a damascene trench into the inter-level dielectric for peripheral wiring.

14. The method of claim 13, wherein the damascene trench is etched using tri-layer lithography.

15. The method of claim 13, further comprising:
    defining a first via through the inter-level dielectric to connect the peripheral wiring to a peripheral wiring interconnect.

16. The method of claim 15, further comprising:
    defining a second via to connect the top wire to the magnetic tunnel junction substantially simultaneously with the defining of the first via, in accordance with a single tri-layer lithography step.

17. The method of claim 15, wherein the defining comprises:
    defining the first via in accordance with a first tri-layer lithography step; and
    defining a second via to connect the top wire to the magnetic tunnel junction, in accordance with a second tri-layer lithography step.

18. The method of claim 11, further comprising:
    defining a via through the dielectric under layer to connect the top wire to the magnetic tunnel junction.

19. The method of claim 18, wherein the via is defined using tri-layer lithography.

* * * * *